(12) United States Patent
Kim et al.

(10) Patent No.: US 11,309,193 B2
(45) Date of Patent: Apr. 19, 2022

(54) SEMICONDUCTOR DEVICE AND METHOD OF FORMING SIP MODULE OVER FILM LAYER

(71) Applicant: STATS ChipPAC Pte. Ltd., Singapore (SG)

(72) Inventors: OhHan Kim, In-cheon (KR);
KyungHwan Kim, Seoul (KR);
WoonJae Beak, Incheon (KR);
HunTeak Lee, Gyeongi-do (KR);
InSang Yoon, Seoul (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 17/010,221

(22) Filed: Sep. 2, 2020

(65) Prior Publication Data
US 2020/0402817 A1 Dec. 24, 2020

Related U.S. Application Data

(62) Division of application No. 15/459,997, filed on Mar. 15, 2017, now Pat. No. 10,804,119.

(51) Int. Cl.
*H01L 23/552* (2006.01)
*H01L 21/56* (2006.01)
(Continued)

(52) U.S. Cl.
CPC .......... *H01L 21/568* (2013.01); *H01L 21/561* (2013.01); *H01L 21/6835* (2013.01);
(Continued)

(58) Field of Classification Search
CPC . H01L 23/552; H01L 21/4825; H01L 21/563; H01L 23/28; H01L 24/14; H01L 21/561; H01L 21/78; H01L 23/49811; H01L 23/49838; H01L 21/4853; H01L 21/485; H01L 2224/81005;
(Continued)

(56) References Cited

U.S. PATENT DOCUMENTS 6,001,671 A 12/1999 Fjelstad
8,048,781 B2 11/2011 How
(Continued)

*Primary Examiner* — Ismail A Muse
(74) *Attorney, Agent, or Firm* — Robert D. Atkins; Patent Law Group: Atkins and Associates, P.C.

(57) ABSTRACT

A semiconductor device has a semiconductor die or component, including an IPD, disposed over an attach area of a penetrable film layer with a portion of the semiconductor die or component embedded in the penetrable film layer. A conductive layer is formed over a portion of the film layer within the attach area and over a portion of the film layer outside the attach area. An encapsulant is deposited over the film layer, conductive layer, and semiconductor die or component. The conductive layer extends outside the encapsulant. An insulating material can be disposed under the semiconductor die or component. A shielding layer is formed over the encapsulant. The shielding layer is electrically connected to the conductive layer. The penetrable film layer is removed. The semiconductor die or component disposed over the film layer and covered by the encapsulant and shielding layer form an SIP module without a substrate.

18 Claims, 14 Drawing Sheets

(51) Int. Cl.
*H01L 23/58* (2006.01)
*H01L 23/31* (2006.01)
*H01L 21/683* (2006.01)
*H01L 23/00* (2006.01)
*H01L 25/16* (2006.01)

(52) U.S. Cl.
CPC ............ *H01L 23/31* (2013.01); *H01L 23/552* (2013.01); *H01L 23/585* (2013.01); *H01L 23/3107* (2013.01); *H01L 24/13* (2013.01); *H01L 24/16* (2013.01); *H01L 24/96* (2013.01); *H01L 25/16* (2013.01); *H01L 2221/68327* (2013.01); *H01L 2221/68381* (2013.01); *H01L 2224/0401* (2013.01); *H01L 2224/05111* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/1146* (2013.01); *H01L 2224/11334* (2013.01); *H01L 2224/13023* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/16237* (2013.01); *H01L 2924/1815* (2013.01); *H01L 2924/19105* (2013.01); *H01L 2924/3025* (2013.01)

(58) Field of Classification Search
CPC . H01L 2224/16227; H01L 2224/04105; H01L 2924/19041; H01L 2924/19105; H01L 2924/19042; H01L 24/96; H01L 21/568; H01L 2224/12105; H01L 24/92; H01L 24/97; H01L 2924/14; H01L 2924/3025
See application file for complete search history.

(56) References Cited

U.S. PATENT DOCUMENTS

| | | |
|---|---|---|
| 9,144,183 B2 | 9/2015 | Chen et al. |
| 9,214,610 B2 | 12/2015 | Tseng et al. |
| 9,271,436 B2 | 2/2016 | Chen et al. |
| 9,627,228 B1* | 4/2017 | Chen .................... H01L 21/4871 |
| 9,859,229 B2* | 1/2018 | Tsai ..................... H01L 25/0657 |
| 2011/0298101 A1 | 12/2011 | Pagaila et al. |
| 2012/0250443 A1 | 10/2012 | Saeaswat et al. |
| 2013/0200528 A1 | 8/2013 | Lin et al. |
| 2015/0214129 A1 | 7/2015 | Kawakita et al. |
| 2015/0348936 A1* | 12/2015 | Lin .......................... H01L 24/19 |
| | | 257/659 |
| 2016/0111375 A1 | 4/2016 | Bair |
| 2016/0293514 A1 | 10/2016 | Lin et al. |
| 2016/0300797 A1 | 10/2016 | Shim et al. |
| 2016/0351509 A1* | 12/2016 | Dang .................. H01L 25/0655 |
| 2017/0018507 A1* | 1/2017 | Pagaila ............. H01L 23/3135 |
| 2017/0133323 A1 | 5/2017 | Ho et al. |
| 2017/0135219 A1* | 5/2017 | Hsu .................... H01L 23/49822 |
| 2017/0148744 A1* | 5/2017 | Carson ................ H01L 21/561 |
| 2017/0229400 A1* | 8/2017 | Choi .................... H01L 23/3121 |
| 2017/0243832 A1 | 8/2017 | Hong et al. |
| 2017/0345793 A1 | 11/2017 | Miyairi |
| 2017/0373048 A1 | 12/2017 | Yu et al. |
| 2018/0012863 A1 | 1/2018 | Yu et al. |
| 2018/0012881 A1 | 1/2018 | Scanlan |
| 2018/0026010 A1 | 1/2018 | Huang et al. |
| 2018/0040569 A1 | 2/2018 | Lee |
| 2018/0061806 A1 | 3/2018 | Jung et al. |
| 2018/0063948 A1 | 3/2018 | Vincent |
| 2018/0151478 A1* | 5/2018 | Chen ....................... H01L 24/94 |
| 2018/0158768 A1 | 6/2018 | Kim et al. |
| 2018/0158779 A1 | 6/2018 | Yang et al. |
| 2018/0255667 A1* | 9/2018 | Kawai ................... H01L 23/552 |
| 2018/0269145 A1 | 9/2018 | Paek et al. |

* cited by examiner

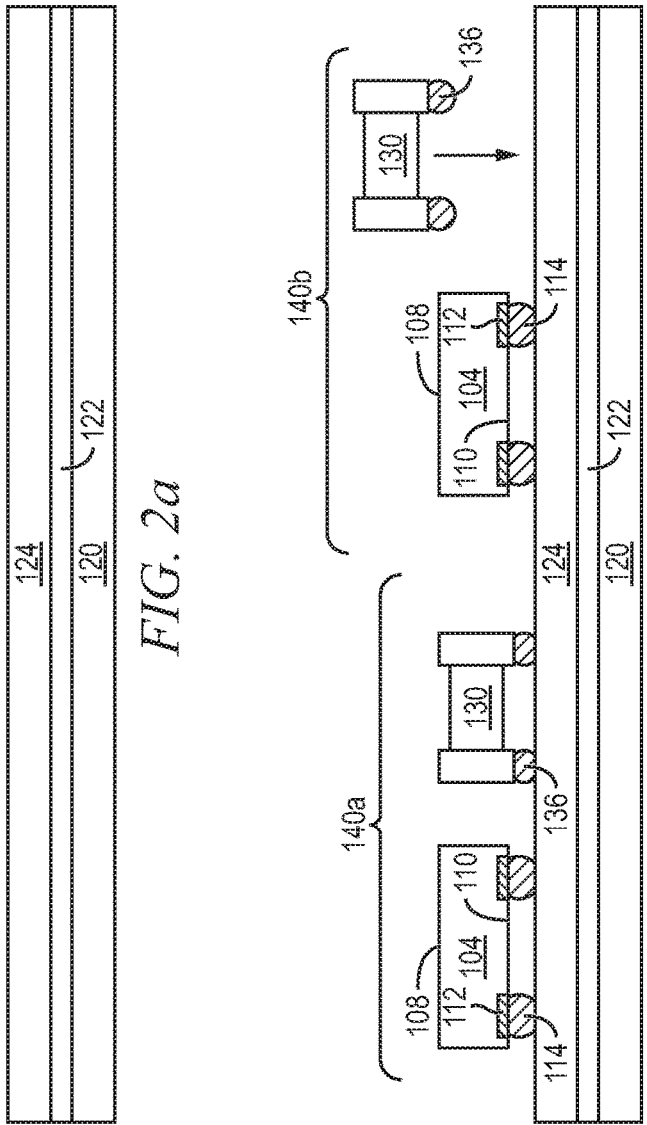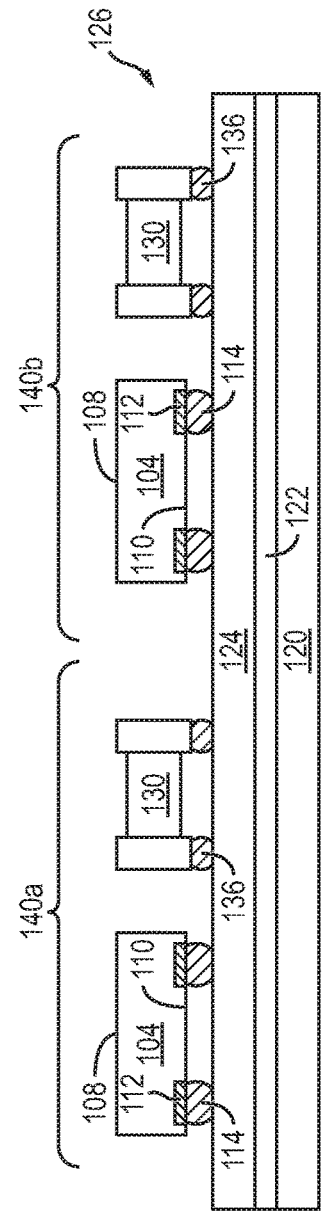

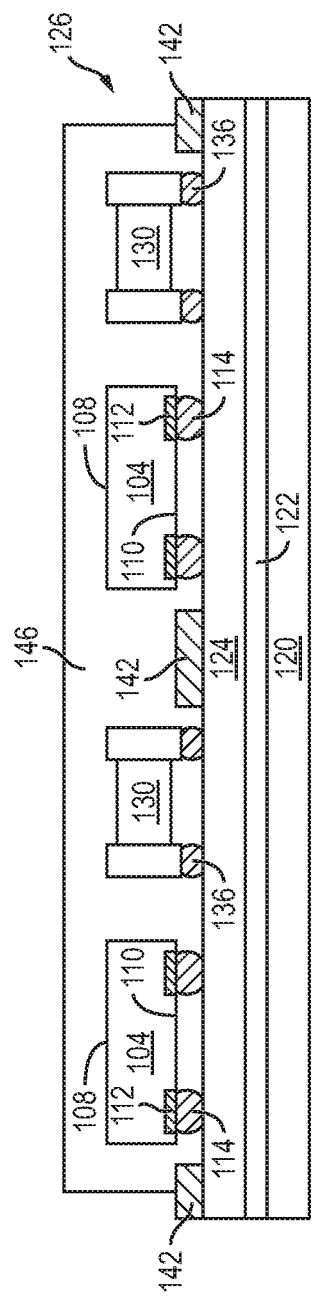

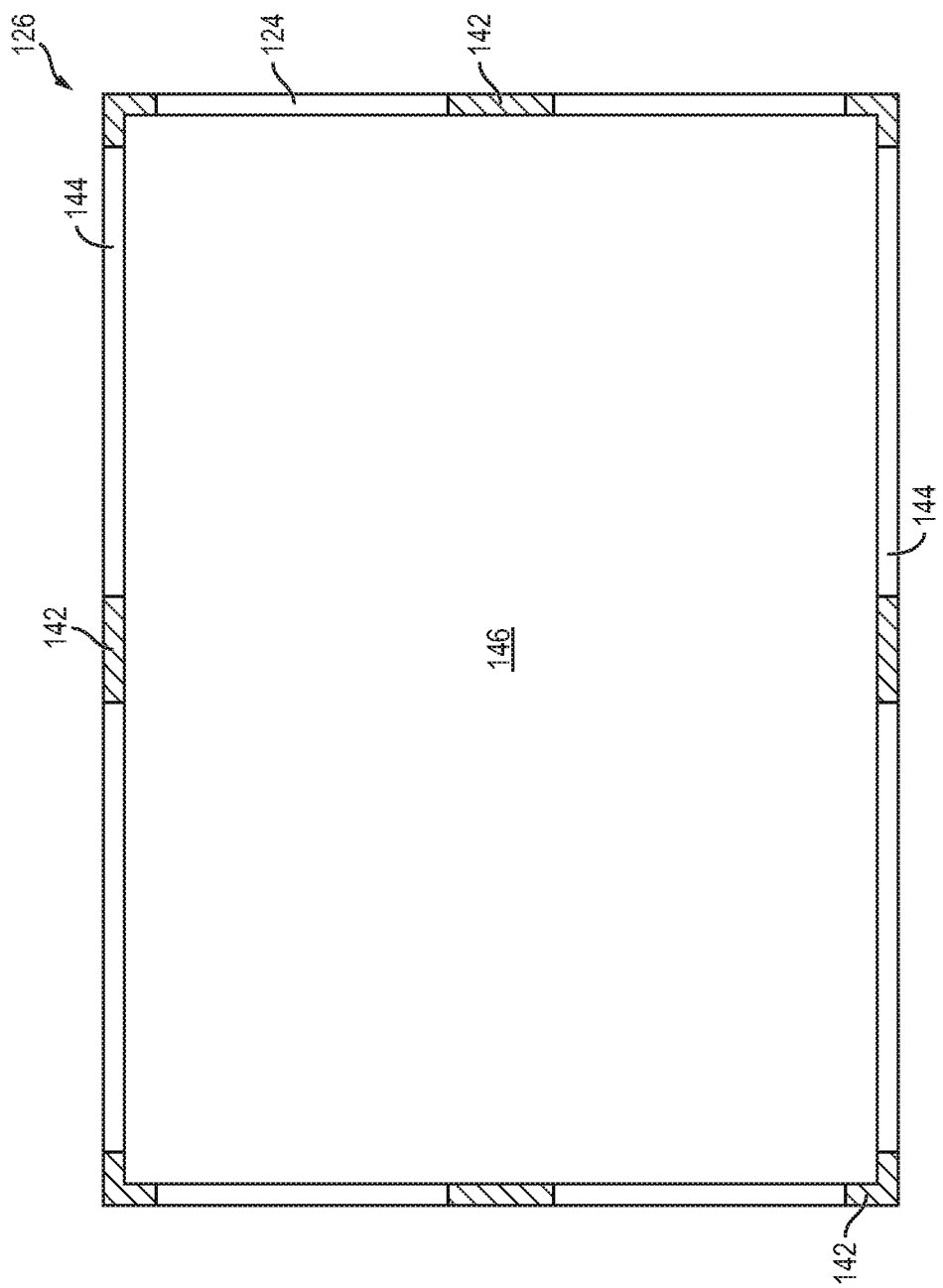

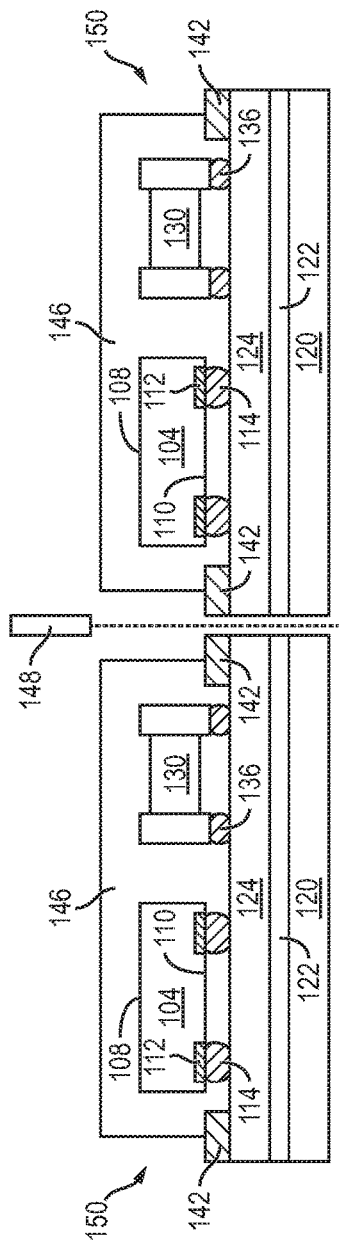
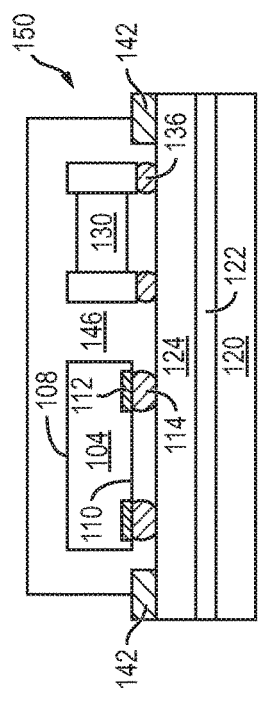
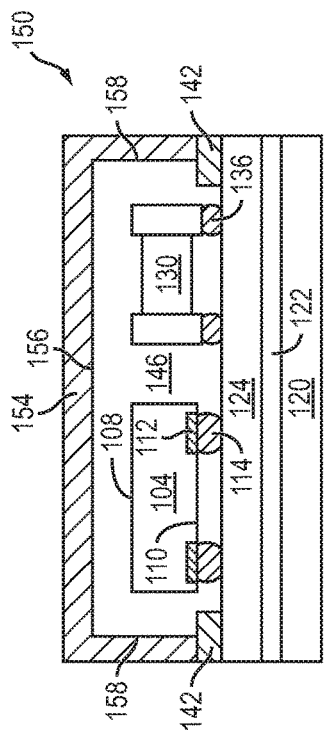
FIG. 2m
FIG. 2n
FIG. 2o

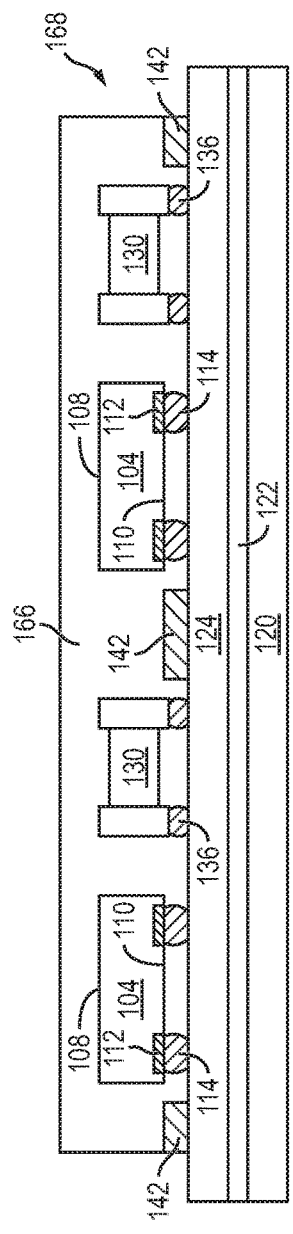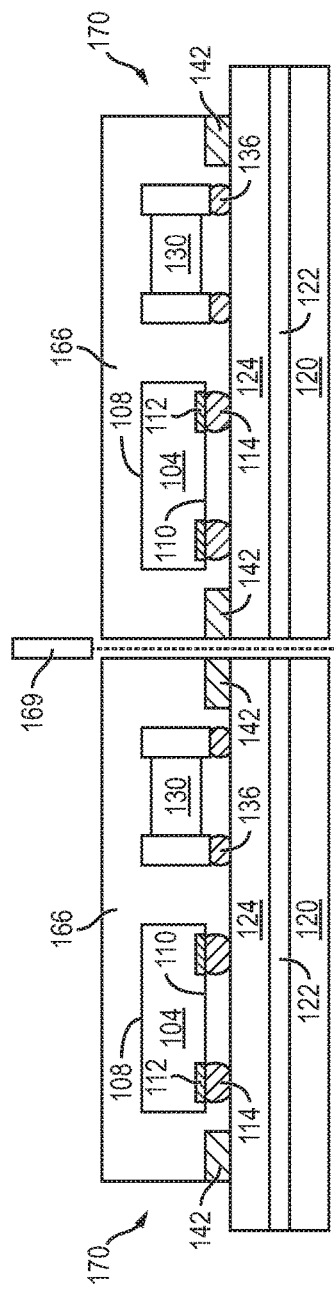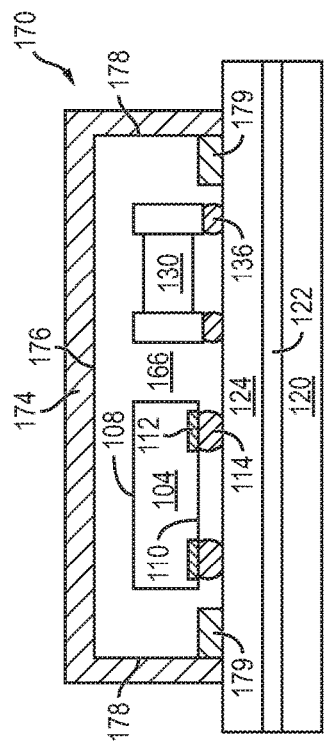

US 11,309,193 B2

SEMICONDUCTOR DEVICE AND METHOD OF FORMING SIP MODULE OVER FILM LAYER

CLAIM TO DOMESTIC PRIORITY

The present application is a division of U.S. patent application Ser. No. 15/459,997, now U.S. Pat. No. 10,804,119, filed Mar. 15, 2017, which application is incorporated herein by reference.

FIELD OF THE INVENTION

The present invention relates in general to semiconductor devices and, more particularly, to a semiconductor device and method of forming an SIP module over a film layer.

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices, particular in high frequency applications such as radio frequency (RF) wireless communications, often contain one or more integrated passive devices (IPDs) to perform necessary electrical functions. The IPDs are susceptible to electromagnetic interference (EMI), radio frequency interference (RFI), harmonic distortion, or other inter-device interference, such as capacitive, inductive, or conductive coupling, also known as cross-talk, which can interfere with their operation. The high-speed switching of digital circuits also generates interference.

Multiple semiconductor die and discrete IPDs can be integrated into a system-in-package (SIP) module for higher density in a small space and extended electrical functionality. The semiconductor die and discrete IPDs are mounted to a substrate for structural support and electrical interconnect. An encapsulant is deposited over the semiconductor die, discrete IPDs, and substrate. A shielding layer is formed over the encapsulant to isolate sensitive circuits. The SIP module substrate is physically mounted and electrically connected to a board in the next level of integration. The substrate can limit design flexibility, increase profile or thickness of the SIP module, and increase manufacturing cost.

BRIEF DESCRIPTION OF THE DRAWINGS

FIGS. 4a-4c illustrate another process of forming an SIP module with a shielding layer over a penetrable film layer;

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
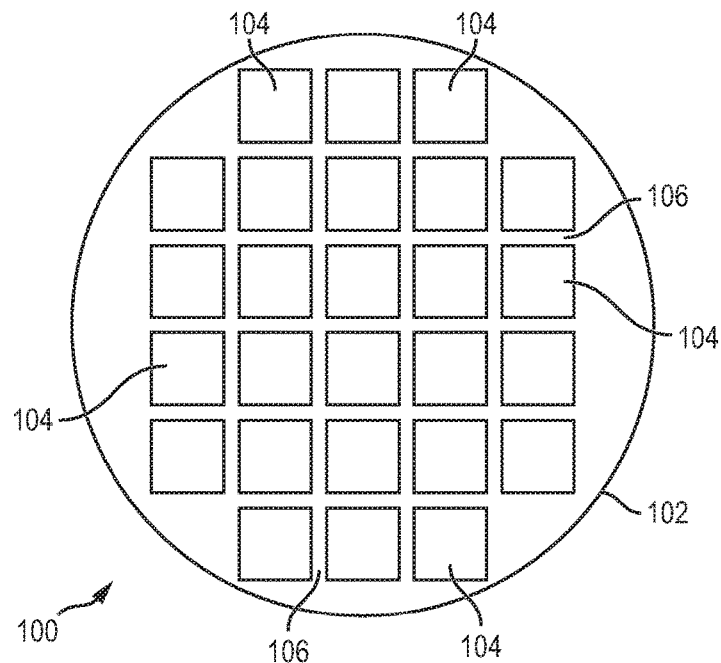
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
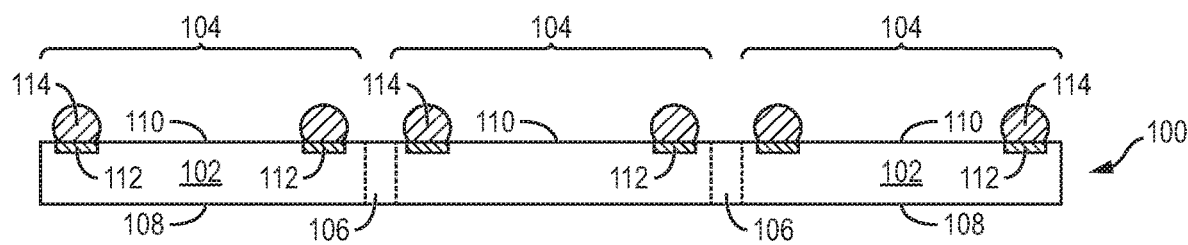

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
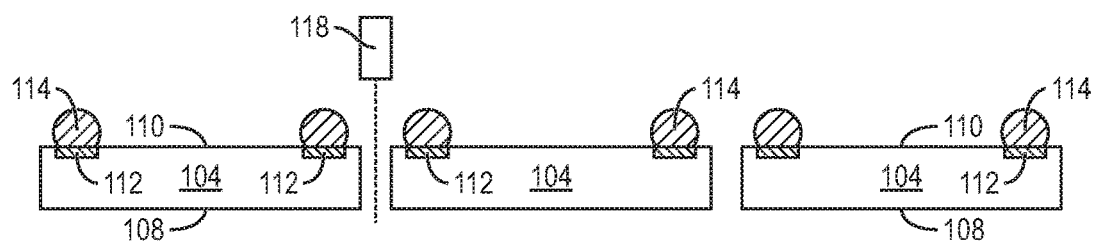

In FIG. 1c, semiconductor wafer 100 is singulated through saw street 106 using a saw blade or laser cutting tool 118 into individual semiconductor die 104. The individual semiconductor die 104 can be inspected and electrically tested for identification of KGD post singulation.

FIGS. 2a-2o illustrate a process of forming an SIP module over a penetrable film layer. FIG. 2a shows a cross-sectional view of a portion of a carrier or temporary substrate 120 containing sacrificial base material such as silicon, polymer, beryllium oxide, glass, or other suitable low-cost, rigid material for structural support. Carrier 150 can be circular or rectangular according to the design or function of the semiconductor package. An interface layer or double-sided tape 122 is formed over carrier 120 as a temporary adhesive bonding film layer, etch-stop layer, or thermal release layer. In one embodiment, interface layer 122 includes polyimide or acrylic film.

A penetrable film layer 124 is formed over carrier 120 using PVD, CVD, printing, spin coating, spray coating, slit coating, rolling coating, lamination, or sintering. In one embodiment, film layer 124 is a polymer, epoxy, acryl-based B-stage material, or other similar material with penetrable properties. Film layer 124 has a thickness of 125 micrometers (μm). Alternatively, film layer 124 can be one or more layers of silicon dioxide (SiO2), silicon nitride (Si3N4), silicon oxynitride (SiON), tantalum pentoxide (Ta2O5), aluminum oxide (Al2O3), silicon dioxide (SiO2), silicon nitride (Si2n4), silicon oxynitride (SiON), tantalum pentoxide (Ta2O5), aluminum oxide (Al2O3), polyimide, benzocyclobutene (BCB), polybenzoxazoles (PBO), or other material having similar insulating and structural properties. Film layer 124 operates as a temporary penetrable substrate for attachment of electronic components.

In FIG. 2b, semiconductor die 104 from FIG. 1c is positioned over and affixed to penetrable film layer 124 using a pick and place operation with active surface 110 and bumps 114 oriented toward the film layer. Likewise, discrete electronic component 130 is also positioned over and affixed to penetrable film layer 124. In one embodiment, discrete electronic component 130 is semiconductor device or IPD, such as a resistor, capacitor, and inductor. Bumps, conductive paste, or other electrical interconnects 136 provides electrical interconnect for discrete electronic component 130. A portion of semiconductor die 104, e.g. bumps 114, and a portion of discrete electronic component 130, e.g. electrical interconnects 136, are embedded in film layer 124. Alternatively, conductive layer 112 on active surface 110 of semiconductor die 104 and connection terminals of discrete electronic component 130 penetrate into film layer 124. Film layer 124 has a low viscosity allowing bumps 114, electrical interconnects 136, and connection terminals of semiconductor die 104 and discrete electronic component 130 to penetrate into the film layer.

Figure 2D:
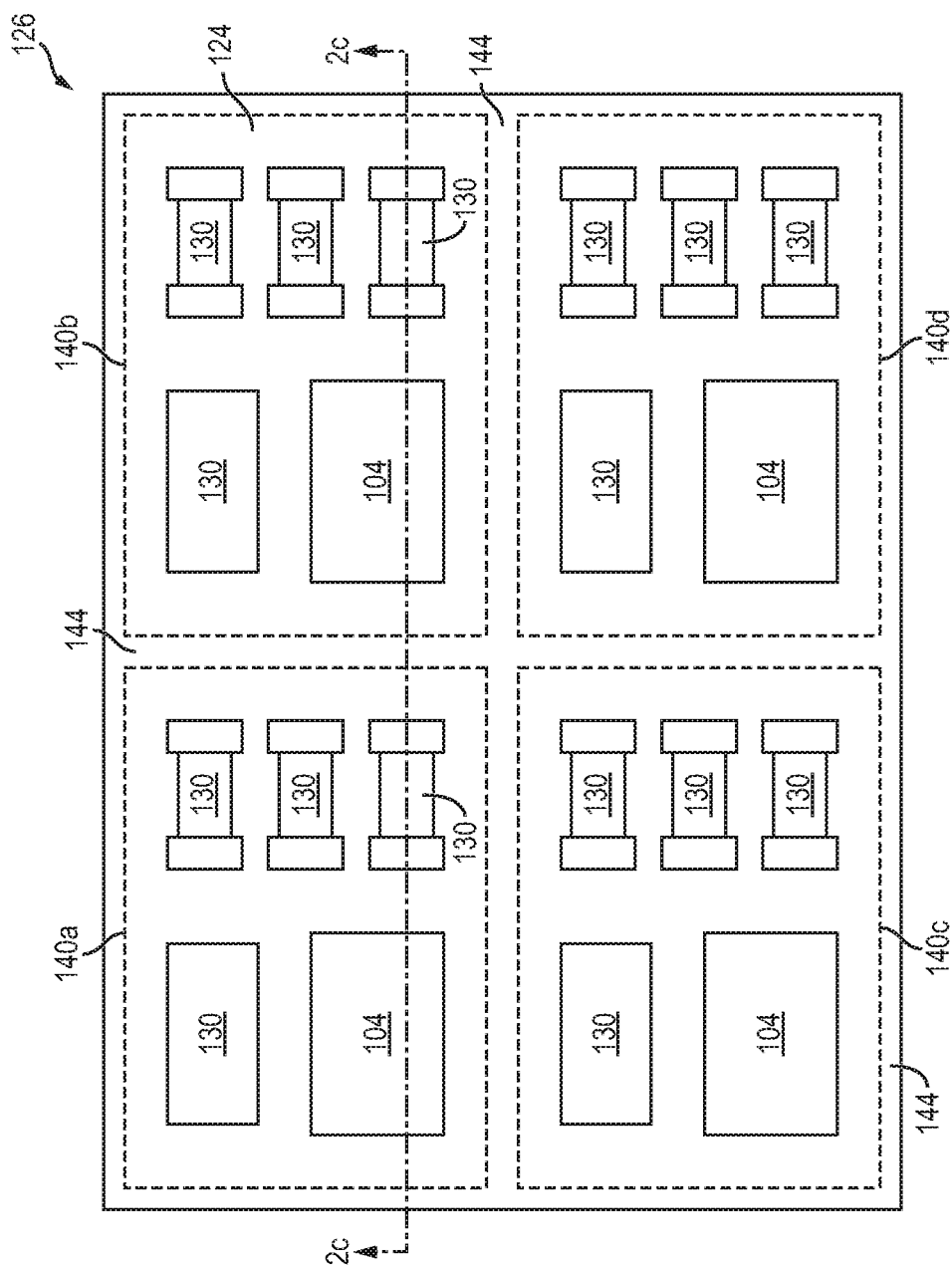
FIGS. 2a-2o illustrate a process of forming an SIP module with a shielding layer over a penetrable film layer.

FIG. 2c shows a cross-sectional view, taken through line 2c-2c of FIG. 2d, of semiconductor die 104 and discrete electronic component 130 affixed to penetrable film layer 124 as reconstituted wafer 126. In one embodiment, only discrete electronic components 130 are affixed to penetrable film layer 124.

FIG. 2d shows a plan view of multiple instances of semiconductor die 104 and discrete electronic component 130 affixed to film layer 124 in component attach areas 140 of reconstituted wafer 126. A first group of semiconductor die 104 and discrete electronic components 130 is disposed in component attach area 140a, a second group of semiconductor die 104 and discrete electronic components 130 is disposed in component attach area 140b, a third group of semiconductor die 104 and discrete electronic components 130 is disposed in component attach area 140c, and a fourth group of semiconductor die 104 and discrete electronic components 130 is disposed in component attach area 140d.

Figure 2E:
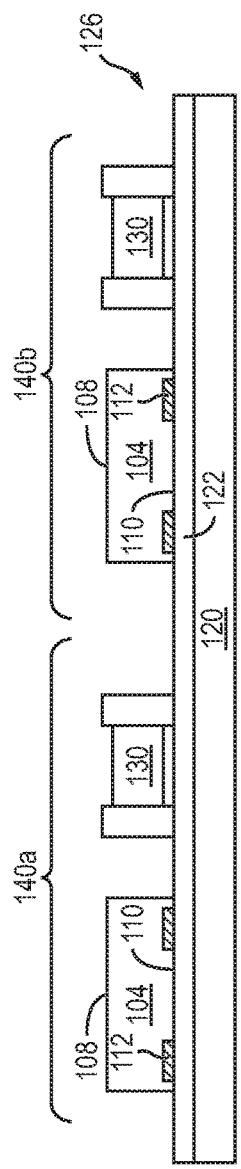
Figure 2F:
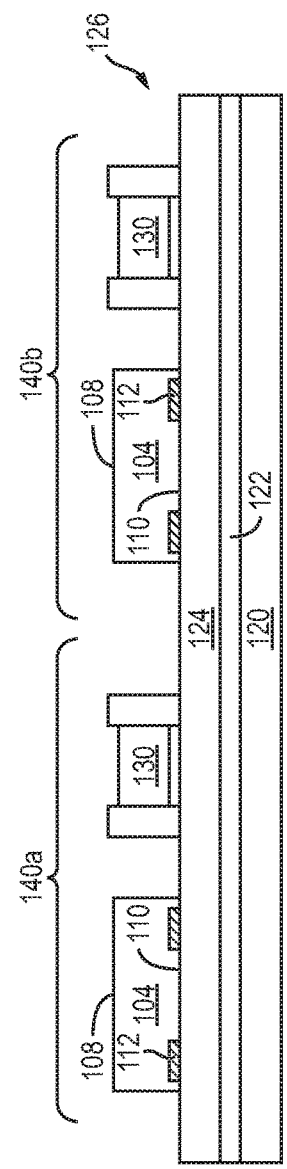

In another embodiment, semiconductor die 104 is positioned over and affixed to interface layer 122 of carrier 120, without penetrable film layer 124, using a pick and place operation with active surface 110 oriented toward the film layer, see FIG. 2e. Likewise, discrete electronic component 130 is also positioned over and affixed to interface layer 122. A surface of semiconductor die 104 and a surface of discrete electronic component 130 contact interface layer 122. In yet another embodiment, semiconductor die 104, without bumps 114, and discrete electronic component 130, without electrical interconnects 136, are disposed on penetrable film layer 124, i.e. a surface of semiconductor die 104 and a surface of discrete electronic component 130 contact the penetrable film layer, as shown in FIG. 2f.

Figure 2G:
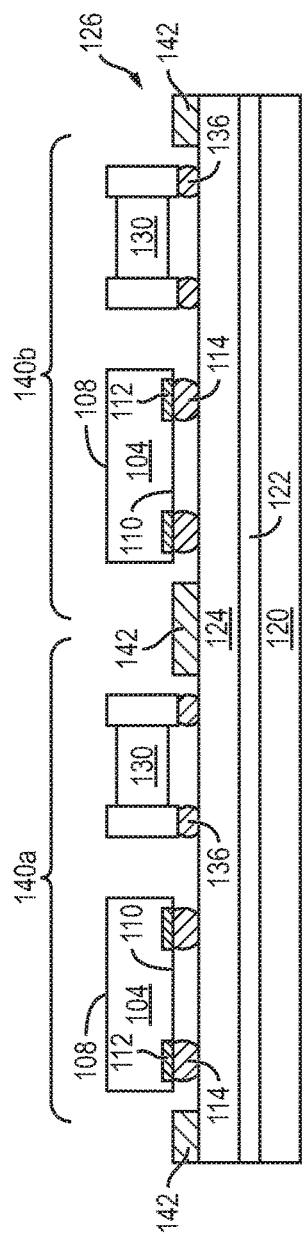
Figure 2H:
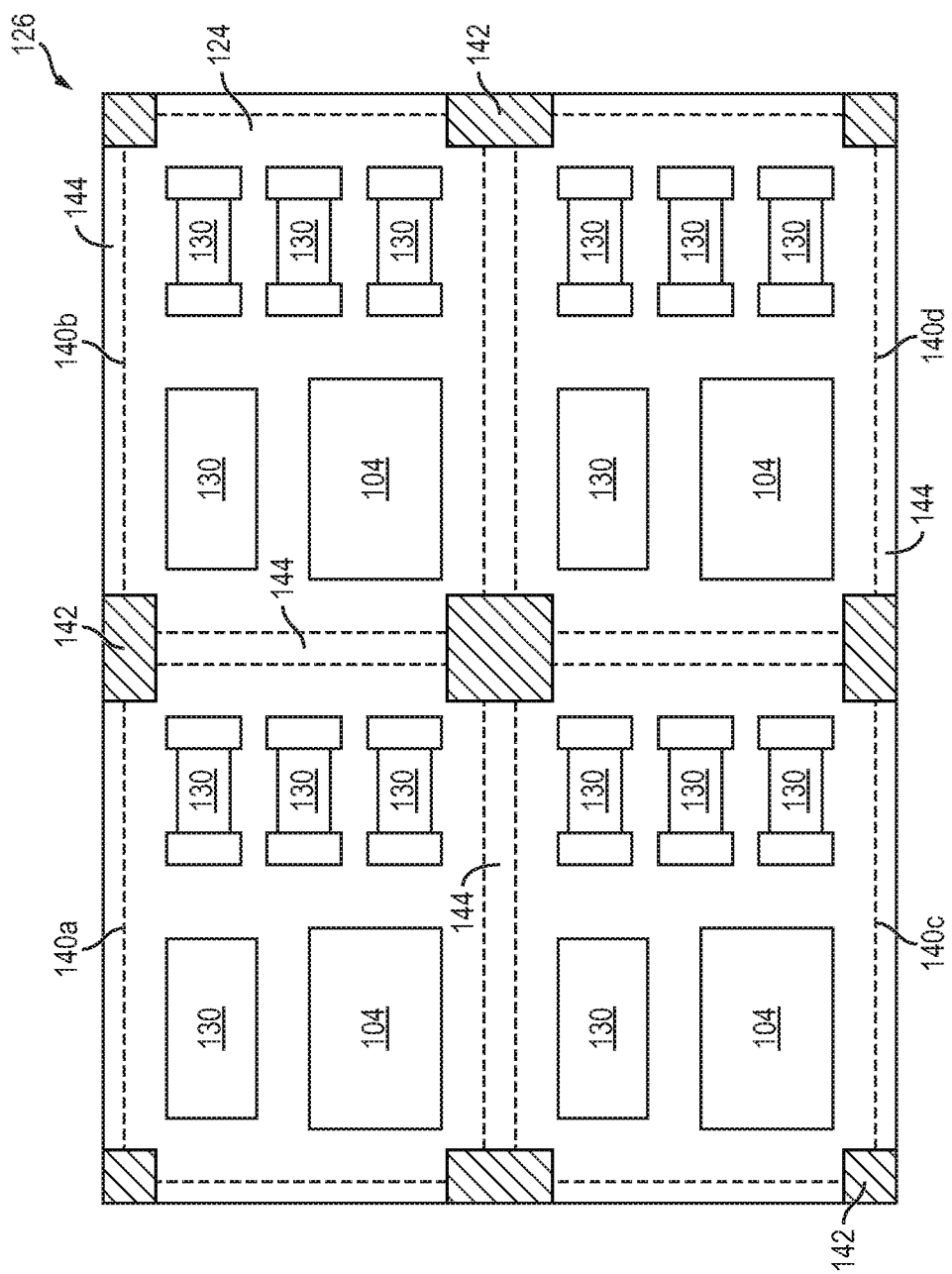

Returning to FIG. 2c, an electrically conductive layer 142 is formed over a portion of component attach areas 140a-140d and over a portion of area 144 between the component attach areas of film layer 124 using PVD, CVD, electrolytic plating, electroless plating process, or other suitable metal deposition process, as shown in FIG. 2g. Conductive layer 142 can be one or more layers of Al, Cu, Sn, Ni, Au, Ag, or other suitable electrically conductive material. Conductive layer 142 is arranged at the corners of component attach areas 140a-140d. The segments of conductive layer 142 can be electrically isolated or electrically common depending on the design and function of semiconductor die 104 and discrete electronic components 130. FIG. 2h shows a plan view of conductive layer 142 covering a portion of component attach areas 140a-140d and overlapping a portion of area 144 of film layer 124 between the component attach areas.

Figure 2I:
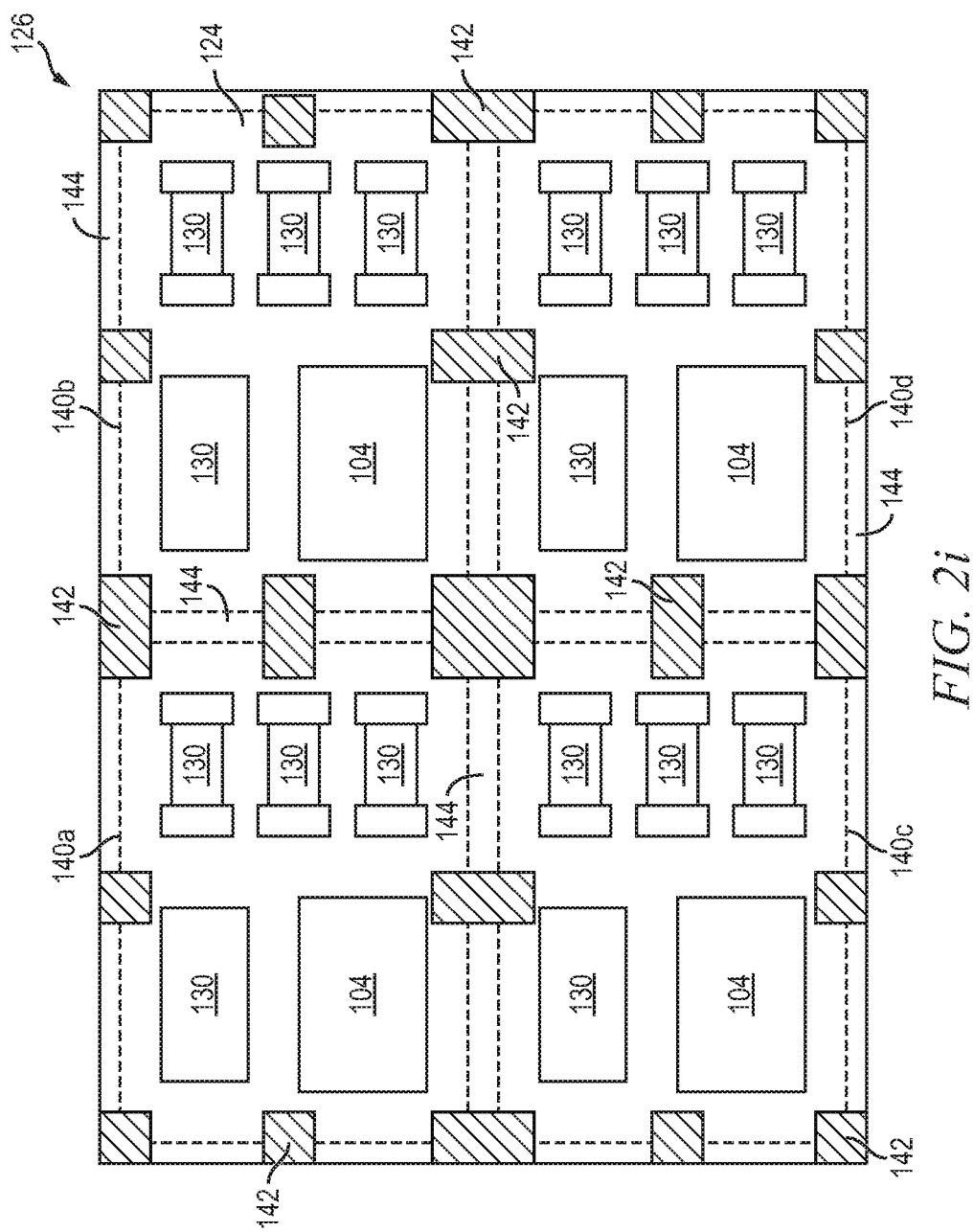
Figure 2J:
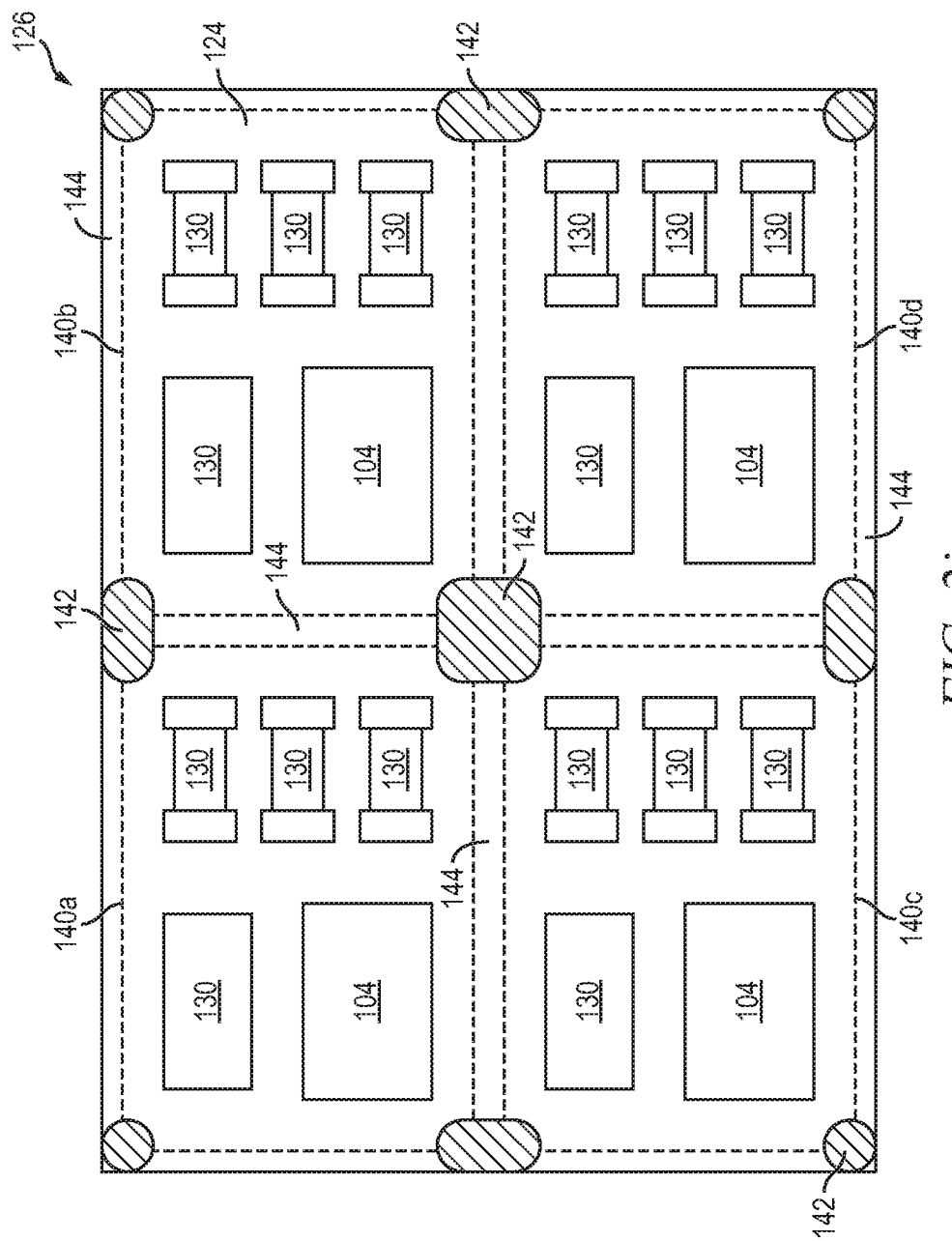

FIG. 2i illustrates another embodiment of conductive layer 142 formed as segments at the corners and around each side of component attach areas 140a-140d. The individual segments of conductive layer 142 can be as electrically isolated or electrically common depending on the design and function of semiconductor die 104 and discrete electronic components 130. FIG. 2j illustrates another embodiment of conductive layer 142 formed with a rounded shape at the corners of component attach areas 140a-140d.

In FIG. 2k, an encapsulant or molding compound 146 is deposited over semiconductor die 104, discrete electronic component 130, film layer 124, and a portion of conductive layer 142 using a paste printing, compressive molding, transfer molding, liquid encapsulant molding, vacuum lamination, spin coating, or other suitable applicator. Encapsulant 146 can be polymer composite material, such as epoxy resin with filler, epoxy acrylate with filler, or polymer with proper filler. Encapsulant 146 is non-conductive, provides structural support, and environmentally protects the semiconductor device from external elements and contaminants. In one embodiment, encapsulant 146 covers top surfaces and side surfaces of semiconductor die 104 and discrete electronic component 130, as well as between the semiconductor die and discrete electronic component and film layer 124. FIG. 2l shows a plan view of encapsulant 146 covering component attach areas 140a-140d and a portion of conductive layer 142 on reconstituted wafer 126.

In FIG. 2m, reconstituted wafer 126 is singulated through areas 144 using a saw blade or laser cutting tool 148 into individual SIP modules 150. FIG. 2n shows SIP module 150 containing, for example, the first group of semiconductor die 104 and discrete electronic components 130 as disposed in component attach area 140a. A portion of conductive layer 142 extends laterally outside encapsulant 146 by nature of the conductive layer overlapping a portion of area 144 of film layer 124 between the component attach areas 140a-140b.

Semiconductor die 104 and discrete electrical component 130 may contain IPDs that are susceptible to EMI, RFI, harmonic distortion, and inter-device interference. For example, the IPDs contained within semiconductor die 104 and discrete electrical component 130 provide the electrical characteristics needed for high frequency applications, such as resonators, high-pass filters, low-pass filters, band-pass filters, symmetric Hi-Q resonant transformers, and tuning capacitors.

To reduce the effects of EMI and RFI, shielding layer 154 is formed over major surface 156 and side surfaces 158 of encapsulant 146, as shown in FIG. 2o. Shielding layer 154 can be one or more layers of Al, Cu, Sn, Ni, Au, Ag, or other suitable conductive material. Alternatively, shielding layer 154 can be carbonyl iron, stainless steel, nickel silver, low-carbon steel, silicon-iron steel, foil, conductive resin, carbon-black, aluminum flake, and other metals and composites capable of reducing the effects of EMI, RFI, and other inter-device interference. Shielding layer 154 is electrically connected to conductive layer 142 as an external ground point of SIP module 150 to reduce the influence of EMI and RFI on semiconductor die 104 and discrete electronic component 130.

The temporary carrier 120, interface layer 122, and penetrable film layer 124 are removed by chemical etching, mechanical peel-off, CMP, mechanical grinding, thermal bake, ultra-violet (UV) light, laser scanning, or wet stripping to expose bumps 114 of semiconductor die 104 and electrical interconnects 136 of discrete electronic component 130, or other connection terminals of the semiconductor die and discrete electronic component. Carrier 120, interface layer 122, and penetrable film layer 124 can be removed prior to singulation in FIG. 2m.

Figure 3A:
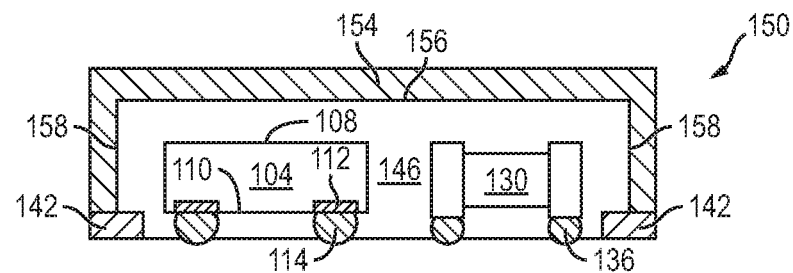
FIGS. 3a-3b illustrate the SIP module as formed over a penetrable film layer from FIGS. 2a-2o.

FIG. 3a illustrates SIP module 150 with shielding layer 154 covering major surface 156 and side surfaces 158 of encapsulant 146. Shielding layer 154 electrically contacts conductive layer 142 as an external ground point to reduce the influence of EMI and RFI on SIP module 150. Semiconductor die 104 and discrete electronic component 130 are initially affixed to film layer 124, with bumps 114 and electrical interconnects 136 embedded within the film layer. Semiconductor die 104 and discrete electronic component 130 are covered by encapsulant 146. When film layer 124 is removed, semiconductor die 104 and discrete electronic component 130 continue to be supported by encapsulant 146 within SIP module 150, without a substrate. Bumps 114 and electrical interconnects 136 can formed after removing carrier 120, interface layer 122, and film layer 124. In the case of a surface of semiconductor die 104 and a surface of discrete electronic component 130 being disposed on interface layer 122 or penetrable film layer 124, see FIGS. 2e and 2f, bumps 114 and electrical interconnects 136 can formed after forming shielding layer 154, or after removing carrier 120, interface layer 122, and film layer 124.

Figure 3B:
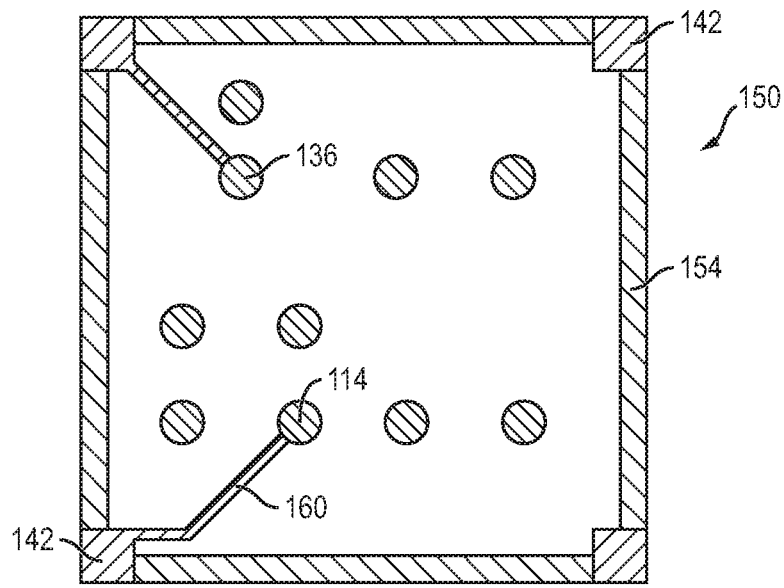

FIG. 3b shows a bottom view of SIP module 150 with bumps 114 and electrical interconnects 136 exposed from encapsulant 146 for external electrical interconnect. Alternatively, connection terminals of semiconductor die 104 and discrete electronic component 130 are exposed from encapsulant 146 for external electrical interconnect. Trace lines 160 are formed over encapsulant 146 and provide an electrical connection between conductive layer 142 and bumps 114 and electrical interconnects 136. The process of forming SIP module 150 over removable film layer 124, without a substrate, provides higher design flexibility, lower profile, reduced defects and failures, and lower manufacturing cost.

In another embodiment continuing from FIG. 2g, an encapsulant or molding compound 166 is deposited over semiconductor die 104, discrete electronic component 130, film layer 124, and a portion of conductive layer 142 using a paste printing, compressive molding, transfer molding, liquid encapsulant molding, vacuum lamination, spin coating, or other suitable applicator, as shown in FIG. 4a. Encapsulant 166 can be polymer composite material, such as epoxy resin with filler, epoxy acrylate with filler, or polymer with proper filler. Encapsulant 166 is non-conductive, provides structural support, and environmentally protects the semiconductor device from external elements and contaminants. In one embodiment, encapsulant 166 covers top surfaces and side surfaces of semiconductor die 104 and discrete electronic component 130, as well as between the semiconductor die and discrete electronic component and film layer 124.

In FIG. 4b, reconstituted wafer 168 is singulated through areas 144 using a saw blade or laser cutting tool 169 into individual SIP modules 170.

Semiconductor die 104 and discrete electrical component 130 may contain IPDs that are susceptible to EMI, RFI, harmonic distortion, and inter-device interference. For example, the IPDs contained within semiconductor die 104 and discrete electrical component 130 provide the electrical characteristics needed for high frequency applications, such as resonators, high-pass filters, low-pass filters, band-pass filters, symmetric Hi-Q resonant transformers, and tuning capacitors.

To reduce the effects of EMI and RFI, shielding layer 174 is formed over major surface 176 and side surfaces 178 of encapsulant 146 and side surfaces 179 of conductive layer 142 in SIP module 170, as shown in FIG. 4c. Shielding layer 154 can be one or more layers of Al, Cu, Sn, Ni, Au, Ag, or other suitable conductive material. Alternatively, shielding layer 174 can be carbonyl iron, stainless steel, nickel silver, low-carbon steel, silicon-iron steel, foil, conductive resin, carbon-black, aluminum flake, and other metals and composites capable of reducing the effects of EMI, RFI, and other inter-device interference. Shielding layer 174 is electrically connected to conductive layer 142 as an external ground point of SIP module 170 to reduce the influence of EMI and RFI on semiconductor die 104 and discrete electronic component 130.

The temporary carrier 120 and interface layer 122 are removed by chemical etching, mechanical peel-off, CMP, mechanical grinding, thermal bake, ultra-violet (UV) light, laser scanning, or wet stripping to expose bumps 114 of semiconductor die 104 and electrical interconnects 136 of discrete electronic component 130, or other connection terminals of the semiconductor die and discrete electronic component. Carrier 120, interface layer 122, and penetrable film layer 124 can be removed prior to singulation in FIG. 4b.

Figure 5:
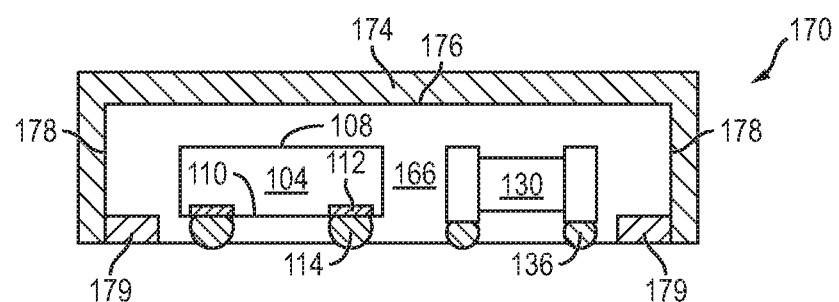
FIG. 5 illustrates the SIP module as formed over a penetrable film layer from FIGS. 4a-4c.

FIG. 5 illustrates SIP module 170 with shielding layer 174 covering major surface 176 and side surfaces 178 of encapsulant 146 and side surfaces 179 of conductive layer 142. Shielding layer 174 electrically contacts conductive layer 142 as an external ground point to reduce the influence of EMI and RFI on SIP module 170. Semiconductor die 104 and discrete electronic component 130 are initially affixed to film layer 124, with bumps 114 and electrical interconnects 136 embedded within the film layer. Semiconductor die 104 and discrete electronic component 130 are covered by encapsulant 166. When film layer 124 is removed, semiconductor die 104 and discrete electronic component 130 continue to be supported by encapsulant 166 within SIP module 170, without a substrate. Bumps 114 and electrical interconnects 136 can formed after removing carrier 120, interface layer 122, and film layer 124. In the case of a surface of semiconductor die 104 and a surface of discrete electronic component 130 being disposed on interface layer 122 or penetrable film layer 124, see FIGS. 2e and 2f, bumps 114 and electrical interconnects 136 can formed after forming shielding layer 174, or after removing carrier 120, interface layer 122, and film layer 124.

Figure 6:
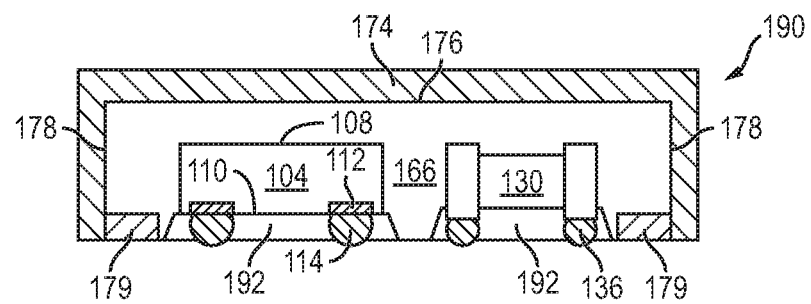
FIG. 6 illustrates another embodiment of the SIP module with underfill material under the electrical components.

FIG. 6 illustrates another embodiment of SIP module 190, similar to FIG. 5, with underfill or insulating material 192, such as epoxy resin, deposited around bumps 114 of semiconductor die 104 and around electrical interconnects of discrete electronic component 130.

Figure 7:
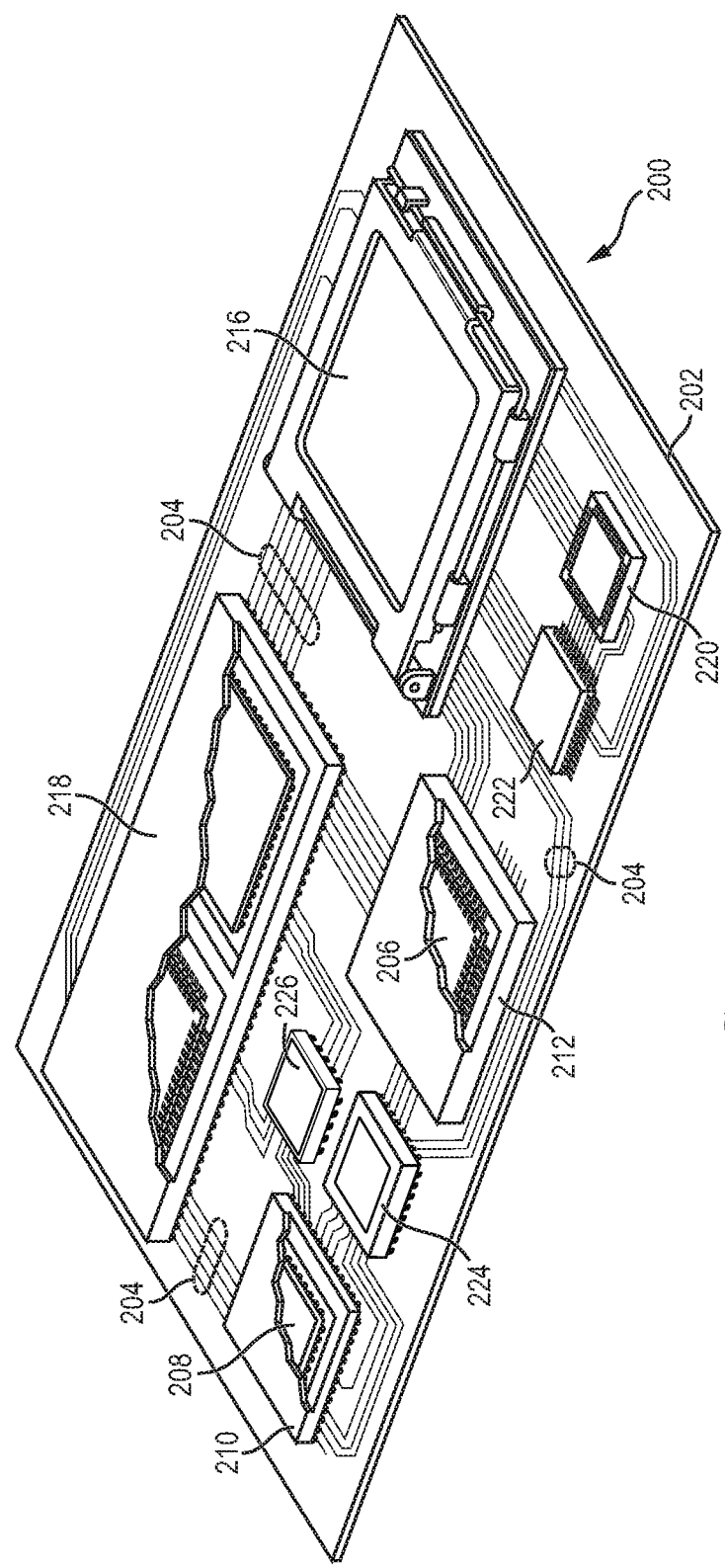
FIG. 7 illustrates a printed circuit board (PCB) with different types of packages mounted to a surface of the PCB.

FIG. 7 illustrates electronic component 200 having a chip carrier substrate or PCB 202 with a plurality of semiconductor packages mounted on a surface of PCB 202, including SIP modules 150 and 170. Electronic device 200 can have one type of semiconductor package, or multiple types of semiconductor packages, depending on the application.

Electronic device 200 can be a stand-alone system that uses the semiconductor packages to perform one or more electrical functions. Alternatively, electronic device 200 can be a subcomponent of a larger system. For example, electronic device 200 can be part of a tablet, cellular phone, digital camera, communication system, or other electronic device. Alternatively, electronic device 200 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 7, PCB 202 provides a general substrate for structural support and electrical interconnect of the semiconductor packages mounted on the PCB. Conductive signal traces 204 are formed over a surface or within layers of PCB 202 using evaporation, electrolytic plating, electroless plating, screen printing, or other suitable metal deposition process. Signal traces 204 provide for electrical communication between each of the semiconductor packages, mounted components, and other external system components. Traces 204 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB.

For the purpose of illustration, several types of first level packaging, including bond wire package 206 and flipchip 208, are shown on PCB 202. Additionally, several types of second level packaging, including ball grid array (BGA) 210, bump chip carrier (BCC) 212, land grid array (LGA) 216, multi-chip module (MCM) 218, quad flat non-leaded package (QFN) 220, quad flat package 222, embedded wafer level ball grid array (eWLB) 224, and wafer level chip scale package (WLCSP) 226 are shown mounted on PCB 202. In one embodiment, eWLB 224 is a fan-out wafer level package (Fo-WLP) and WLCSP 226 is a fan-in wafer level package (Fi-WLP). Depending upon the system requirements, any combination of semiconductor packages, configured with any combination of first and second level packaging styles, as well as other electronic components, can be connected to PCB 202. In some embodiments, electronic device 200 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:
1. A semiconductor device, comprising:
   a penetrable film layer;

a semiconductor die or electrical component disposed over an attach area of the penetrable film layer with an electrically conductive portion of the semiconductor die or electrical component embedded within the penetrable film layer;

a conductive layer in contact with the penetrable film layer, wherein the conductive layer extends over a first portion of the penetrable film layer within the attach area of the penetrable film layer under the semiconductor die or electrical component to contact the electrically conductive portion of the semiconductor die or electrical component;

an encapsulant deposited over the penetrable film layer, conductive layer, and semiconductor die or electrical component; and an electromagnetic shielding layer formed over the encapsulant.

2. The semiconductor device of claim 1, wherein the electromagnetic shielding layer contacts the conductive layer.

3. The semiconductor device of claim 1, wherein the conductive layer further extends over a second portion of the penetrable film layer outside the attach area of the penetrable film layer.

4. The semiconductor device of claim 1, further including an insulating material disposed under the semiconductor die or electrical component.

5. The semiconductor device of claim 1, wherein the electrically conductive portion of the semiconductor die or electrical component embedded within the penetrable film layer includes a plurality of bumps.

6. A semiconductor device, comprising:
a substrate;
an electrical component disposed over an attach area of the substrate with an electrically conductive portion of the electrical component embedded within the substrate;
a conductive layer formed in contact with the substrate, wherein the conductive layer extends over a first portion of the substrate within the attach area of the substrate under the electrical component to contact the electrically conductive portion of the electrical component;
an encapsulant deposited over the substrate and electrical component; and
an electromagnetic shielding layer formed over the encapsulant layer and extending to contact the conductive layer.

7. The semiconductor device of claim 6, wherein the conductive layer further extends over a second portion of the substrate outside the attach area of the substrate.

8. The semiconductor device of claim 6, further including an insulating material disposed under the electrical component.

9. The semiconductor device of claim 6, wherein the electrical component includes an integrated passive device.

10. The semiconductor device of claim 6, wherein the electrically conductive portion of the electrical component embedded within the penetrable substrate includes a plurality of bumps.

11. A semiconductor device, comprising:
a penetrable substrate;
an electrical component disposed over an attach area of the penetrable substrate with a portion of the electrical component embedded within the penetrable substrate;
a conductive layer in contact with the penetrable substrate, wherein the conductive layer extends over a first portion of the substrate within the attach area of the penetrable substrate under the electrical component to contact the electrically conductive portion of the electrical component and further over a second portion of the penetrable substrate outside the attach area of the penetrable substrate;
an encapsulant deposited over the substrate and electrical component; and
an electromagnetic shielding layer formed over the encapsulant.

12. The semiconductor device of claim 11, wherein the electromagnetic shielding layer contacts the conductive layer.

13. The semiconductor device of claim 11, further including an insulating material disposed under the electrical component.

14. The semiconductor device of claim 11, wherein the electrical component includes an integrated passive device.

15. The semiconductor device of claim 11, wherein the portion of the electrical component embedded within the substrate includes a plurality of bumps.

16. A semiconductor device, comprising:
a substrate;
an electrical component disposed over an attach area of the substrate with a portion of the electrical component embedded within the substrate;
a conductive layer in contact with the substrate, wherein the conductive layer extends over a first portion of the substrate within the attach area of the substrate under the electrical component to contact the electrically conductive portion of the electrical component and further over a second portion of the substrate outside the attach area of the substrate;
an encapsulant deposited over the substrate and electrical component; and
an electromagnetic shielding layer over the encapsulant.

17. The semiconductor device of claim 16, wherein the electromagnetic shielding layer contacts the conductive layer.

18. The semiconductor device of claim 16, further including an insulating material disposing under the electrical component.

* * * * *